(12) United States Patent
Tong

(10) Patent No.: US 11,921,152 B2
(45) Date of Patent: Mar. 5, 2024

(54) METHOD FOR DISTINGUISHING A SIGNAL AND ITS IMAGE

(71) Applicant: Ling Tong, Tiburon, CA (US)

(72) Inventor: Ling Tong, Tiburon, CA (US)

( * ) Notice: Subject to any disclaimer, the term of this patent is extended or adjusted under 35 U.S.C. 154(b) by 217 days.

(21) Appl. No.: 17/531,737

(22) Filed: Nov. 20, 2021

(65) Prior Publication Data

US 2023/0160947 A1 May 25, 2023

(51) Int. Cl.
*G01R 31/28* (2006.01)
*G01R 23/16* (2006.01)

(52) U.S. Cl.
CPC .............. *G01R 31/2822* (2013.01)

(58) Field of Classification Search
CPC .... G01R 31/28; G01R 31/2822; G01R 23/16; G01R 23/167
See application file for complete search history.

(56) References Cited

FOREIGN PATENT DOCUMENTS

CN 111030765 * 4/2020 ........... H04B 17/309

* cited by examiner

*Primary Examiner* — Neel D Shah

(57) ABSTRACT

The method is for identifying a signal and its image signal input to the heterodyne frequency sweep system. Comparing to a traditional heterodyne frequency sweep technology, a mixing module with a positive and negative sign filters (PNS filters) is introduced, and the detection and identification module is added, and the typical low-pass filter in the input module is removed. According to the timing order sequence of the signal output from the intermediate frequency (IF) filter and PNS filters, a signal and its image signal can be identified. The bandwidth of the heterodyne frequency sweep system is not limited by the cut-off frequency of the low-pass filter (LPF) of the traditional heterodyne frequency sweep system.

5 Claims, 4 Drawing Sheets

METHOD FOR DISTINGUISHING A SIGNAL AND ITS IMAGE

BACKGROUND OF THE INVENTION

The present invention relates to the area of electronic measurement technology. More particularly, it relates to a method of identifying a signal and its image signal input to a heterodyne frequency sweep system.

Due to the development of electronic information technology, the heterodyne frequency sweep technology is used more and more in the signal processing, especially in the spectrum analysis. Frequency of modern spectrum analysis has increased to Terahertz and the frequency resolution to Hertz, and spectrum analyzers are becoming an indispensable technology in the research, development and manufacturing of electronic measurement equipment and instruments. By the reason of a signal and its image signal with the same intermediate frequency output times from a heterodyne frequency sweep system, low-pass filters are used in the input module of spectrum analyzers and the center frequency of intermediate frequency (IF) filters are set to higher frequencies to avoid spectrum aliasing and image interference. For such spectrum analyzers, multistage mixing is necessary to increase the frequency resolution as shown as FIG. 3. This results in a more complicated system and the need for more excellent devices performance, for example requiring higher frequency of mixer and frequency sweep local oscillator. Further, it makes the single side phase noise of the system higher, sensitivity lower, and reduces the measurement range.

Alternatively, with the development of micro-millimeter wave measurement, the use of vector network analyzers (VNA) as the key instrument expands the measuring scattering parameters of devices to the signal spectrum analyzing, yielding a more integrated measurement system. Being constructed using a frequency sweep signal generator and receiver, VNA can be used in the models: VNA, frequency sweep signal generator, and spectrum analyzer. However, the spectrum analyzer in the VNA cannot identify a signal and its image due to the absence of low-pass filter in the input module and the frequency mixing theory. Therefore, identifying a signal and its image signal is a key requirement for VNA to become an integrated measurement system.

SUMMARY

By the reason of a signal and its image signal with the same intermediate frequency output times from a heterodyne frequency sweep system, techniques for identifying a signal and its image signal are provided in the present invention to avoid signal spectrum aliasing and image interference. More specifically, the present invention provides methods for identifying a signal and its image signal input to a heterodyne frequency sweep system. Because bandwidth is not being limited by a low-pass filter in the input module, the heterodyne frequency sweep system abilities can be improved significantly. Based on traditional heterodyne frequency sweep technology, only positive and negative sign (PNS) filters, the detection and identification model are added, and the low-pass filter in the input module is removed. A signal and its image signal can be identified quickly using the timing order sequence of the output signals from the PNS filters and the IF filter in the mixing module.

For the invention purpose, the present invention comprises circuits some of which are implementing an identification model. Without loss of generality, circuits are grouped in modules for clarity purposes. Again, without loss of generality, the identification model can be implemented using digital circuits. The circuits are here grouped into three modules: an input module, a mixing module with heterodyne frequency sweep, and a detection and identification module as per FIG. 1, Note that:

The circuits in the input module are different from that of a traditional heterodyne frequency sweep system, in that it does not include a low-pass filter and hence does not filter-out image signals.

The mixing module with heterodyne frequency sweep includes a mixer, a frequency sweep local oscillator, an IF filter, a positive filter and a negative sign filter (PNS filters). The pass-band of the IF filter does not intersect with that of the PNS filters. Additionally, the center frequency of the positive sign filter is higher than that of the IF filter, and the center frequency of the negative sign filter is lower than that of the IF filter.

The detection and identification module includes three detectors, an analog-digital converter, and a digital circuit. The detectors connect respectively to the IF filter, the positive sign filter and the negative sign filter in the mixing module. The output signals from the detectors go into the digital circuit in the detection and identification module after conversion by the analog-digital convertor.

According to the present invention, the identification model is provided. The input signals adjusted by the input module are mixed with the frequency sweep signals from the local oscillator in the mixer. Then, the intermediate frequency output signals from the mixer are input to the IF filter and the PNS filters. The output signals of the filters are input to the detectors, and converted to digital signals by the analog-digital convertor. The signal and its image signal are identified by the detection and identification module (from here on: digital circuit") according to the timing order sequence of the output signals from the IF filter and the PNS filters as shown in FIG. 2.

The present invention is about a novel heterodyne frequency sweep technique. Based on the traditional heterodyne frequency sweep approach, PNS filters and the detection and identification module are added and the low-pass filters in the input module are removed. The signal and its image signal are identified according to the timing order sequence of the output signals from the filters in the mixing module.

BRIEF DESCRIPTION OF THE DRAWINGS

For a more complete understanding of the present invention, and for further details and advantages thereof, reference is now made to the following drawings and descriptions thereof.

DETAILED DESCRIPTION OF SPECIFIC EMBODIMENTS

In the following, a specific embodiment of the present invention will be described in detail with reference to the accompanying drawings such that those skilled in the art can better understand the invention. It is noted that well-known functions and configurations are not described in detailed to avoid obscuring the present invention. In the embodiment according to the technical area traditions, if the input signal frequency is lower than the local oscillating frequency, the signal is defined as the signal in the present invention. If the input signal frequency is higher than the local oscillating frequency, the signal is defined as the image signal in the present invention.

Figure 4:
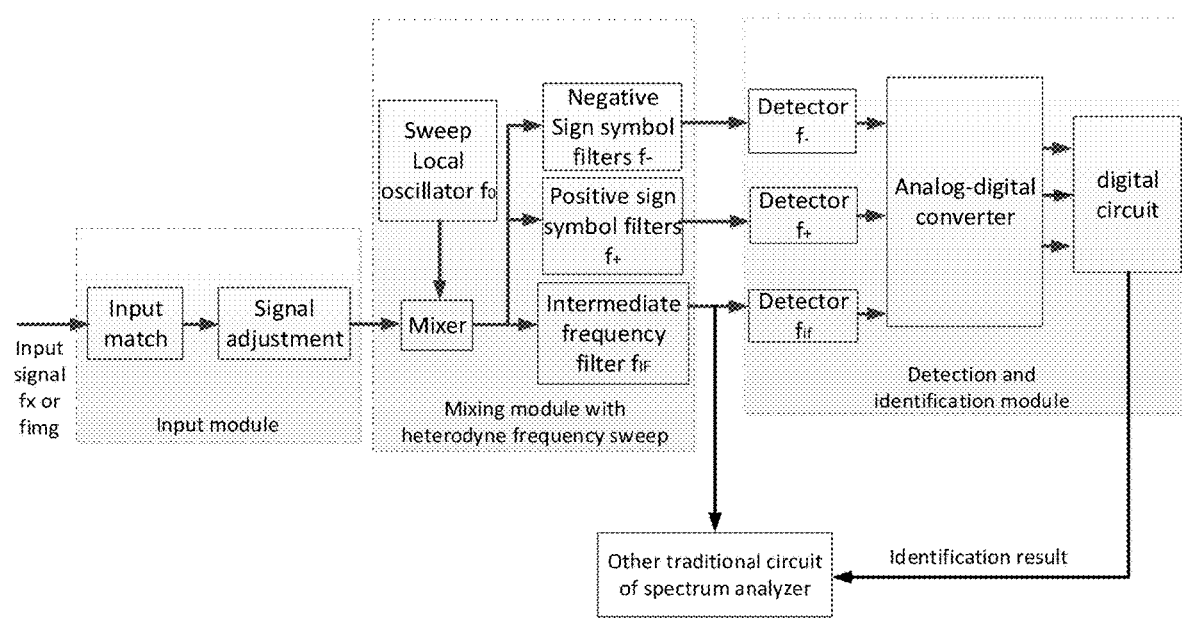
FIG. 4 shows a functional block diagram for an embodiment of identifying a signal and its image signals in a spectrum analyzer with heterodyne frequency sweep.

The embodiment shown in FIG. 4 represents an enhanced spectrum analyzer with heterodyne frequency sweep that can identify signals and associated image signals. It includes the input module, mixing module with heterodyne frequency sweep, detection and identification module, and other circuits and modules of traditional spectrum analyzers with heterodyne frequency sweep.

Figure 3:
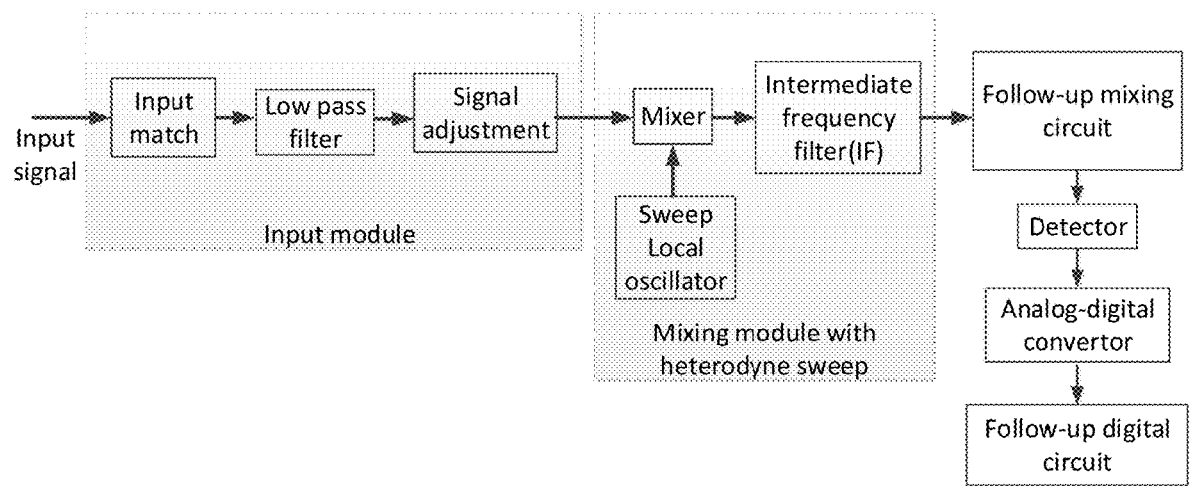
FIG. 3 shows a block diagram of the traditional spectrum analyzer by heterodyne frequency sweep.

In the embodiment shown in FIG. 4, the input module includes input impedance matcher and signal adjustment. The input impedance matcher makes the input impedance of the analyzer match that of the external circuit that provides the signal, and the signal adjustment changes the input signal amplitude to a suitable range. Compared with a traditional spectrum analyzer with heterodyne frequency sweep in FIG. 3, the low-pass filter that could filter out the image signal is removed, so both of a signal and its image signal can be input to the mixing module by the input module. The bandwidth of the spectrum analyzer is not determined by the cut-off frequency of the low-pass filter in the input module.

In the embodiment shown in FIG. 4, the mixing module with heterodyne frequency sweep includes the mixer, the frequency sweep local oscillator, the IF filter, the positive sign filter and the negative sign filter (PNS filters). The frequency sweep local oscillator generates the frequency sweep local signals. The IF filter and the PNS filters are band-pass filters. The frequency band of the IF filter does not intersect with the band of the PNS filters. The center frequency of the positive sign filter is higher than that of the IF filter. The center frequency of the negative sign filter is lower than that of the IF filter.

The output signals from the input module are input to the mixer and mix with the frequency sweep local signals. The intermediate frequency signals from the mixer are input to the IF filter, the positive sign filter, and the negative sign filter.

In the embodiment shown in FIG. 4, the detection and identification module includes three detectors, an analog-digital converter and a digital circuit. The signals from the IF filter, the positive sign filter and the negative sign filter in the mixing module are input respectively to the detectors in the detection and identification module. According to the timing order sequence of the output signals from the IF filter, the positive sign filter and the negative sign filter, a signal or its image signal can be identified.

The identification model is according to the following: If the timing order sequence of the output signals from the filters is such that the signal from the negative sign filter appear first, then appear from the IF filter and lastly appear from the positive sign filter, then the signal frequency is lower than that of the frequency sweep local signal, it is identified as the signal. If the timing order sequence of the signals from the filters is such that the signal from the positive sign filter appear first, then appear from the IF filter and lastly appear from the negative sign filter, then the signal frequency is higher than that of the sweep local signal, it is identified as the image signal.

Figure 1:
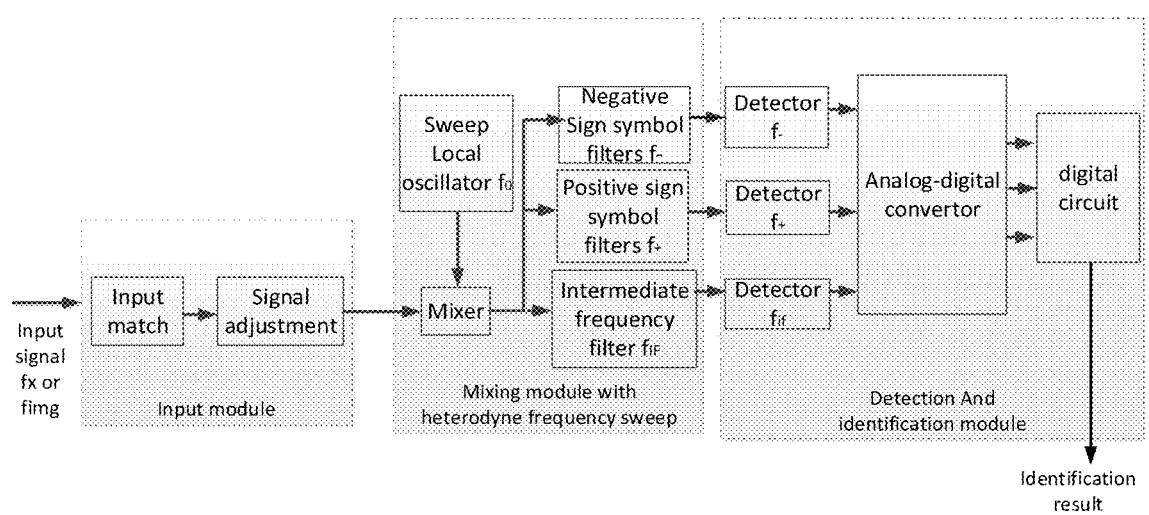
FIG. 1 shows a block diagram of a heterodyne frequency sweep system that can identify a signal and its image signal as in the present invention.
Figure 2:
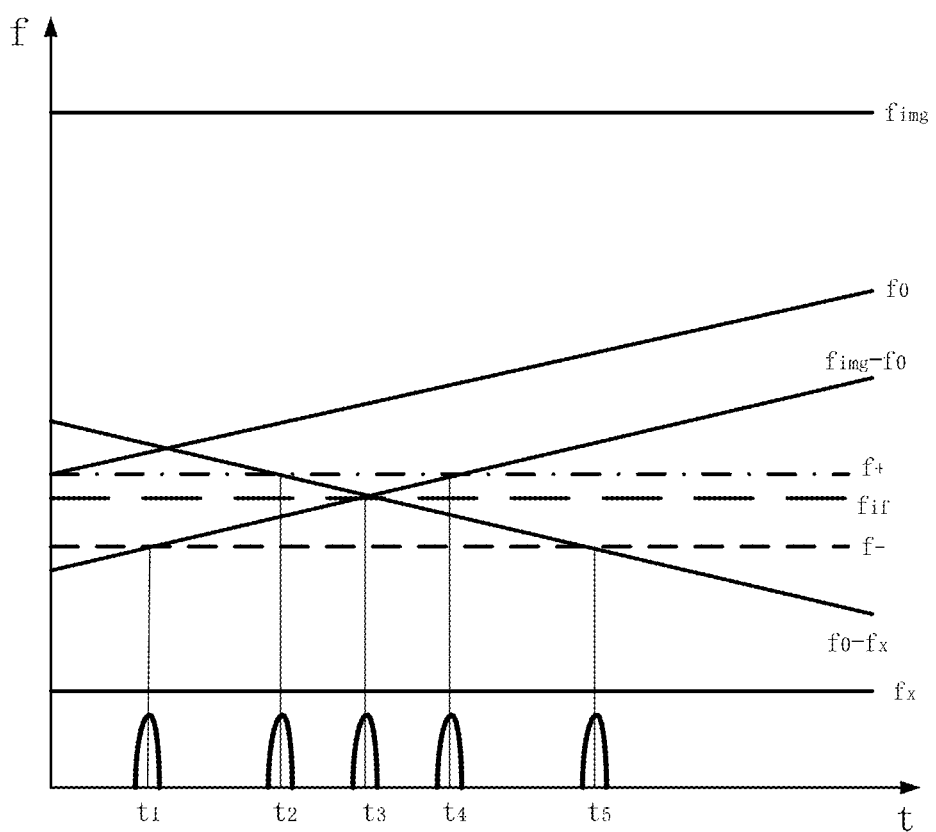
FIG. 2 shows the timing order sequence of the signals in the heterodyne frequency sweep system with the present invention.

FIG. 2 shows a timing order sequence of the output signals from the filters, the frequency sweep local signals, a signal and its image signal. It shows that the intermediate frequency output times of the signal and its image signal from the IF filter are same. The difference is their output times from the positive sign filter and the negative sign filter.

As shown in FIG. 2, the signal output order and time positions from the filters are different due to the mixing with the frequency sweep local signals. The time differences of the output signals from the IF filter, the negative sign filter and the positive sign filter are determined by the center frequency of the IF filter, the negative sign filter and the positive sign filter, and by the frequency sweep speed of the sweep local oscillator, but are not related to the input signals of the spectrum analyzer.

In FIG. 2, the signal frequency is $f_x$, its image signal frequency is $f_{img}$, the frequency of the frequency sweep local signal is $f_0(t)=a+bt$ (a and b are constant), the center frequency of the IF filters is $f_{if}$, the center frequency of the positive sign filter is $f_+$, the center frequency of the negative sign filter is $f_-$.

After the signal mixing with the frequency sweep local signal, the frequency of the output signal from the intermediate frequency port of the mixer is $f_0(t)-f_x=(a+bt)-f_x$, and the signal is input to the IF filter and the PNS filters. At time $t_1$, $t_3$ and $t_4$, the frequency of output signal is equal to the center frequency $f_-$ of the negative sign filter, the center frequency $f_{if}$ of the IF filter and the center frequency $f_+$ of the positive sign filter, respectively. Therefore at time $t_1$, $t_3$ and $t_4$, there are output signals from the negative sign filter, IF filter and the positive sign filter.

After its image signal mixing with the frequency sweep local signal, the frequency of the output signal from the intermediate frequency port of the mixer is $f_{img}-f_0(t)=f_{img}-(a+bt)$, the signal is input to the IF filter and the PNS filters. At time $t_2$, $t_3$ and $t_5$, the signal frequency is equal to the center frequency $f_+$ of the positive sign filter, the center frequency $f_{if}$ of the IF filter and the center frequency $f_-$ of the negative sign filter respectively. Therefore at time $t_2$, $t_3$ and $t_5$, there are output signals from the positive sign filter, IF filter and the negative sign filter.

According to the above description, if the timing order sequence of the output signals from the filters is that it from the negative sign filter appears first, then appears from the IF filter, lastly appears from the positive sign filter, the signal frequency is lower than that of the frequency sweep local signal, the signal input to the spectrum analyzer is the signal. If the timing order sequence of output signals from the filters is that it from the positive sign filter appears first, then appears from the IF filter, lastly appears from the negative sign filter, the signal frequency is higher than that of the frequency sweep local signal, the signal input to the spectrum analyzer is the image signal.

In summary, the lower or higher frequency of the signals input to the spectrum analyzer than that of the frequency sweep local signal can be decided according to the timing order sequence of the output signal from filters. So a signal or its image signal can be identified accordingly.

After identifying a signal and its image signal, the output signal from the IF filter is input to the other traditional circuits of the spectrum analyzer, and showed the measurement result about the signal and its image signal correctly.

GENERAL

Without any loss of generality, the present invention can be used in spectrum analysis technology or the vector network analyzer, to enable that signal(s) and its image(s) signal can be detected effectively. Additionally, practitioners can also use the present invention more generally in other area according to their need in the detection of signal (s) and its image signal(s).

Unless specifically stated otherwise, as apparent from the following discussions, it is appreciated that throughout the specification discussions utilizing terms such as "detecting", "identifying", "signal", "image signal", "the spectrum analyzer with heterodyne sweep" or the like, refer to the action and/or processes. In a similar manner, the term "detecting an image signal" may refer to "identifying an image signal" and may refer to any device. Unless specifically state otherwise, the terms "detection" and "identification" are used interchangeably. The methodologies described herein are, in one embodiment, can be performed by one or more device. In such embodiments, any device capable of executing this set of signal processing that specifies actions to be taken may be included. Thus, one example is a spectrum analyzer with heterodyne sweep. Another example is a vector network analyzer. Note that when a method includes several elements, e.g., several steps, no ordering of such elements is implied, unless specifically stated.

Note that while some diagram(s) only show(s) a circuit, those skilled in the art understand that several circuits as described above are included, but not explicitly shown or described in order not to obscure the inventive aspect.

Note that, as would be known to one skilled in the art, if the number the units to be produced justifies the cost, any set of instructions in combination with elements. Thus, as will be appreciated by those skilled in the art, embodiments of the present invention may be embodied as a method, an apparatus such as a special purpose apparatus. Accordingly, aspects of the present invention may take the form of a method, an entirely hardware embodiment, an entirely software embodiment or an embodiment combining software and hardware aspects.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All publications, patents, and patent applications cited herein are hereby incorporated by reference, except in those jurisdictions where incorporation by reference is not permitted. In such jurisdictions, the Applicant reserves the right to insert portions of any such cited publications, patents, or patent applications if Applicant considers this advantageous in explaining and/or understanding the disclosure, without such insertion considered new matter.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

Note that the claims attached to this description form part of the description, so are incorporated by reference into the description, each claim forming a different set of one or more embodiments.

What is claimed is:

1. A method for identifying a signal and its image signal in a heterodyne frequency sweep system, the method comprising:

circuits and an identifying model;

the circuits further comprising an input module, a mixing module with heterodyne frequency sweep and a detection and identification module;

the input module further comprising input impedance matching and signal adjustment sub-circuits, wherein a low-pass filter that may filters the image signal to be detected is not included;

the mixing module with heterodyne frequency sweep further comprising a mixer, a frequency sweep local oscillator (SLO), an intermediate frequency (IF) filter, a positive and a negative sign filter (PNS filters) sub-circuits, wherein the center frequency of positive sign filter is higher than that of the IF filter and the center frequency of negative sign filter is lower than that of the IF filter, and the pass band of IF filter, positive sign filter and negative sign filter does not intersect each other;

the detection and identification module further comprising an IF detector, a positive sign detector, a negative sign detector, analog-digital convertors, and a digital circuit;

a configuration wherein the output signal from the input module is mixed with the frequency sweep local signal in the mixing module;

a configuration wherein the output signals of the mixing module are input to the IF filter, the positive sign filter and the negative sign filter, respectively;

a configuration wherein the output signals from the IF filter, the positive sign filter and negative sign filter are input to the detection and identification module, the signal and its image are identified by an identifying model using the timing order sequence of the output signals from the IF, PNS filters in the detection and identification module.

2. The method of claim 1 wherein the identification model further comprising:

a signal and its image signal input to heterodyne frequency sweep system can be identified by the timing order sequence of the output signals from the IF filter, the positive sign filter and negative sign filter;

if the timing order sequence of the output signals is such that the output signal from the negative sign filter appears first, then appears from that of the IF filter, and lastly appears that from the positive sign filter, then the signal frequency is lower than that of the frequency sweep local signal, the signal input to the heterodyne frequency sweep system is identified as the signal;

if the timing order sequence of the output signals is such that the output signal from the positive sign filter appears first, then appears that from the IF filter, and lastly appears that from the negative sign filter, then the signal frequency is higher than that of the frequency sweep local signal, the input to the heterodyne frequency sweep system is identified as an image signal.

3. The method of claim 1 wherein the output time differences of the signals from the IF filter, the positive sign filter and negative sign filter are determined from the center frequencies of the IF filter, PNS filters and the sweep speed of SLO.

4. The method of claim 1 wherein the low-pass filter in the input module that filters the image signals is removed.

5. The method of claim 1 wherein the band-width of the heterodyne frequency sweep system is not limited by the cut-off frequency of the low-pass filter in the input module.

* * * * *